US010168797B2

United States Patent
So et al.

(10) Patent No.: US 10,168,797 B2
(45) Date of Patent: Jan. 1, 2019

(54) TERMINAL APPARATUS, AUDIO SYSTEM, AND METHOD FOR CONTROLLING SOUND VOLUME OF EXTERNAL SPEAKER THEREOF

(71) Applicant: SAMSUNG ELECTRONICS CO., LTD., Suwon-si (KR)

(72) Inventors: Yong-jin So, Seongnam-si (KR); Won-hee Lee, Seoul (KR); Chang-hoon Park, Seoul (KR); Eun-jung Jeon, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 252 days.

(21) Appl. No.: 15/151,588

(22) Filed: May 11, 2016

(65) Prior Publication Data
US 2017/0031648 A1    Feb. 2, 2017

Related U.S. Application Data

(60) Provisional application No. 62/198,359, filed on Jul. 29, 2015.

(30) Foreign Application Priority Data

Sep. 3, 2015 (KR) .......................... 10-2015-0124718

(51) Int. Cl.
*G06F 3/02* (2006.01)
*G06F 3/16* (2006.01)
(Continued)

(52) U.S. Cl.
CPC .............. *G06F 3/02* (2013.01); *G06F 3/0482* (2013.01); *G06F 3/04842* (2013.01);
(Continued)

(58) Field of Classification Search
CPC ...... G06F 3/02; G06F 3/0482; G06F 3/04842; G06F 3/04847; G06F 3/04883;
(Continued)

(56) References Cited

U.S. PATENT DOCUMENTS

2010/0299639 A1\* 11/2010 Ramsay ................ G06F 3/0486
715/835
2011/0246908 A1\* 10/2011 Akram ........... H04N 21/234318
715/752

(Continued)

OTHER PUBLICATIONS

Anonymous, "Multiple speakers can be connected through AirPlay", Published on Jul. 10, 2015, Total 1 page (total 2 pages including English Translation).

*Primary Examiner* — Mandrita Brahmachari
(74) *Attorney, Agent, or Firm* — Sughrue Mion, PLLC

(57) ABSTRACT

A user terminal apparatus is provided. The user terminal apparatus includes a touchscreen configured to display a plurality of first user interface (UI) elements for adjusting respective sound volumes of the plurality of speaker apparatuses and a plurality of second UI elements for receiving a selection of a speaker apparatus of the plurality of speaker apparatuses, to group speaker apparatuses of the plurality of speaker apparatuses, the grouped speaker apparatuses corresponding to selected UI elements from among the plurality of second UI elements, and to receive sound volume adjusting input through one of the plurality of first UI elements corresponding to any one of the plurality of grouped speaker apparatuses, and a controller configured to change all first UI elements of the grouped speaker apparatuses based on the sound volume adjusting input.

20 Claims, 11 Drawing Sheets

(51) Int. Cl.
*G06F 3/0484* (2013.01)
*G06F 3/0482* (2013.01)
*G06F 3/0488* (2013.01)
*H04R 27/00* (2006.01)
*H03G 1/02* (2006.01)
*H03G 3/04* (2006.01)
*H03G 3/30* (2006.01)

(52) U.S. Cl.
CPC ...... *G06F 3/04847* (2013.01); *G06F 3/04883* (2013.01); *G06F 3/165* (2013.01); *H03G 1/02* (2013.01); *H03G 3/04* (2013.01); *H03G 3/3005* (2013.01); *H04R 27/00* (2013.01); *H04R 2227/003* (2013.01); *H04R 2227/005* (2013.01); *H04R 2420/01* (2013.01); *H04R 2430/01* (2013.01)

(58) Field of Classification Search
CPC . G06F 3/165; H03G 1/02; H03G 3/04; H03G 3/3005; H04R 27/00; H04R 2227/003; H04R 2227/005; H04R 2420/01
See application file for complete search history.

(56) References Cited

U.S. PATENT DOCUMENTS

| | | | | |
|---|---|---|---|---|
| 2012/0057725 | A1* | 3/2012 | Nakamura | H04H 60/04 381/104 |
| 2013/0288802 | A1* | 10/2013 | Lambourne | G11B 27/00 463/42 |
| 2014/0079247 | A1* | 3/2014 | Sanders | H03G 1/02 381/109 |
| 2014/0363022 | A1* | 12/2014 | Dizon | H03G 3/3005 381/105 |
| 2014/0363024 | A1* | 12/2014 | Apodaca | H03G 3/02 381/109 |

* cited by examiner

TERMINAL APPARATUS, AUDIO SYSTEM, AND METHOD FOR CONTROLLING SOUND VOLUME OF EXTERNAL SPEAKER THEREOF

CROSS-REFERENCE TO RELATED APPLICATIONS

This application claims priority from U.S. Provisional Patent Application No. 62/198,359, filed on Jul. 29, 2015, in the U.S. Patent and Trademark Office, and Korean Patent Application No. 10-2015-0124718, filed on Sep. 3, 2015, in the Korean Intellectual Property Office, the disclosures of which are incorporated herein by reference in its entirety.

BACKGROUND

1. Field

Apparatuses and methods consistent with exemplary embodiments relate to a terminal apparatus, an audio system, and a method for controlling a sound volume of an external speaker thereof, and more particularly, to a terminal apparatus, an audio system, and a method for controlling a sound volume of an external speaker thereof, for simultaneously adjusting sound volumes of a plurality of external speaker apparatuses desired by a user.

2. Related Art

Recently, by virtue of the rapid growth of industries, all electronic apparatuses have been changed from analogue to digital, and digital acoustic apparatuses have also rapidly come into widespread use to enhance sound quality.

A typical speaker apparatus is capable of simply reproducing a sound source provided by wire. More recently, speaker apparatuses have become wirelessly connected to an access point (AP) and are capable of outputting sound content stored in a cloud server. In addition, such recent speaker apparatuses are separately arranged in a plurality of spaces so as to output the same content or to output different contents.

In such an environment, a user is inconvenienced by repeatedly and separately adjusting a sound volume of each speaker apparatus in order to adjust sound volumes of a plurality of speaker apparatuses.

SUMMARY

Exemplary embodiments may address the above disadvantages and other disadvantages not described above. Moreover, the exemplary embodiments are not required to address the disadvantages described above, and an exemplary embodiment may not address any of the problems described above.

Exemplary embodiments provide a terminal apparatus, an audio system, and a method for controlling a sound volume of an external speaker thereof, for simultaneously adjusting sound volumes of a plurality of external speaker apparatuses desired by a user.

According to an aspect of an exemplary embodiment, a sound volume outputting system includes a plurality of speaker apparatuses, and a user terminal apparatus configured to display a plurality of first user interface (UI) elements for adjusting respective sound volumes of the plurality of speaker apparatuses and a plurality of second UI elements for receiving a selection of a speaker apparatus of the plurality of speaker apparatuses, to group speaker apparatuses of the plurality of speaker apparatuses, the grouped speaker apparatuses corresponding to selected UI elements from among the plurality of second UI elements, to receive sound volume adjusting input through one of the plurality of first UI elements corresponding to any one of the plurality of grouped speaker apparatuses, and to control to provide a sound volume adjusting command corresponding to the sound volume adjusting input to adjust a volume of the grouped speaker apparatuses.

Each of the plurality of speaker apparatuses may separately receive and output sound source content from an external server.

According to an aspect of another exemplary embodiment, a user terminal apparatus includes a touchscreen configured to display a plurality of first user interface (UI) elements for adjusting respective sound volumes of the plurality of speaker apparatuses and a plurality of second UI elements for receiving a selection of a speaker apparatus of the plurality of speaker apparatuses, to group speaker apparatuses of the plurality of speaker apparatuses, the grouped speaker apparatuses corresponding to selected UI elements from among the plurality of second UI elements, and to receive sound volume adjusting input through one of the plurality of first UI elements corresponding to any one of the plurality of grouped speaker apparatuses, and a controller configured to change all first UI elements of the grouped speaker apparatuses based on the sound volume adjusting input.

The user terminal apparatus may further include a communication interface configured to transmit a sound volume adjusting command corresponding to the sound volume adjusting input to the plurality of grouped speaker apparatuses based on the sound volume adjusting input.

The sound volume adjusting manipulation may be a mute input, and the controller may control the communication interface to transmit a mute command to the grouped speaker apparatuses The user terminal apparatus may further include a sound volume adjusting button disposed on a lateral surface of the user terminal apparatus, wherein the controller may control the touchscreen to change all first UI elements of the grouped speaker apparatuses according to sound volume adjusting input through the sound volume adjusting button.

The plurality of first UI elements may include a bar and bars and pointers moveable on the bars, and the second UI element may be a check box.

The touchscreen may further include a plurality of third UI elements for receiving selection of a mute command to mute each of the plurality of speaker apparatuses.

The touchscreen may further display a fourth UI element for displaying information of content that is currently being reproduced by the plurality of speaker apparatuses.

The user terminal apparatus may further include a communication interface wirelessly connected to an access point and configured to receive apparatus information from a plurality of speaker apparatuses connected to the access point.

The communication interface may receive reproduced content information from the plurality of speaker apparatuses connected to the access point; and the touchscreen may display only a first UI element and a second UI element of a speaker apparatus, which are outputting the same content, based on the received content information.

According to an aspect of another exemplary embodiment, a method for controlling a sound volume of an external speaker in a user terminal apparatus includes displaying a plurality of first user interface (UI) elements for adjusting respective sound volumes of a plurality of speaker apparatuses and a plurality of second UI elements for receiving a selection of a speaker apparatus, grouping speaker apparatuses of the plurality of speaker apparatuses, the grouped speaker apparatuses corresponding to selected UI elements from among the plurality of second UI elements, receiving sound volume adjusting input through one of the plurality of first UI elements corresponding to any one of the plurality of grouped speaker apparatuses, and changing all first UI elements of the grouped speaker apparatuses based on the sound volume adjusting input.

The method may further include transmitting a sound volume adjusting command corresponding to the sound volume adjusting input to the plurality of grouped speaker apparatuses.

The sound volume adjusting manipulation may be a mute input, and the transmitting may include transmitting the mute input to the grouped speaker apparatuses.

The method may further include receiving manipulation of a sound volume adjusting button disposed on a lateral surface of the user terminal apparatus, wherein the changing of the first UI element may include changing all first UI elements of the grouped speaker apparatuses according to manipulation of the sound volume adjusting button.

The plurality of first UI elements may include bars and pointers moveable on the bars, and the second UI element may be a check box.

The displaying may include further displaying a plurality of third UI elements for receiving selection of a mute command to mute each of the plurality of speaker apparatuses and a fourth UI element for displaying information of content that is currently being reproduced by the plurality of speaker apparatuses.

The user terminal apparatus may be wirelessly connected to an access point, and the receiving of the apparatus information may include receiving apparatus information from a plurality of speaker apparatuses connected to the access point.

The receiving of the apparatus information may include receiving reproduced content information from the plurality of speaker apparatuses connected to the access point, and the displaying of the apparatus information may include displaying only a first UI element and a second UI element of a speaker apparatus, which are outputting the same content, based on the received content information.

According to an aspect of another exemplary embodiment, a computer readable recording medium having recorded thereon a program for executing a method for controlling a sound volume of an external speaker, the method including displaying a plurality of first user interface (UI) elements for adjusting respective sound volumes of a plurality of speaker apparatuses and a plurality of second UI elements for receiving a selection of a speaker apparatus, grouping speaker apparatuses of the plurality of speaker apparatuses, the grouped speaker apparatuses corresponding to selected UI elements from among the plurality of second UI elements, receiving sound volume adjusting input through one of the plurality of first UI elements corresponding to any one of the plurality of grouped speaker apparatuses, and changing all first UI elements of the grouped speaker apparatuses based on the sound volume adjusting input.

According to an aspect of another exemplary embodiment, an electronic apparatus is provided. The electronic apparatus includes: at least one memory comprising computer executable instructions; and at least one processor configured to read and execute the computer executable instructions, the computer executable instructions causing the at least one processor to perform: controlling to display a plurality of first user interface (UI) elements configured to adjust sound volumes of a plurality of speaker apparatuses; controlling to display a plurality of second UI elements configured to receive a selection of a speaker apparatus from among the plurality of speaker apparatuses; receiving an input at least two second UI elements from among the plurality of second UI elements to select at least two speaker apparatuses from among the plurality of speaker apparatuses; receiving a sound volume adjusting input through one of the plurality of first UI elements; and controlling to change all first UI elements corresponding to the at least two speaker apparatuses based on the sound volume adjusting input.

The plurality of first UI elements may include bars and pointers moveable on the bars, and the second UI element may be a check box.

The sound volume adjusting input may be a mute input, and the controller may control the communication interface to transmit a mute command to the at least two speaker apparatuses.

The electronic apparatus may further include a communication interface configured to transmit a sound volume adjusting command corresponding to the sound volume adjusting input to the at least two speaker apparatuses according to the sound volume adjusting input.

Additional and/or other aspects and advantages will be set forth in part in the description which follows and, in part, will be obvious from the description, or may be learned by practice of the exemplary embodiments.

BRIEF DESCRIPTION OF THE DRAWING FIGURES

The above and/or other aspects will be more apparent by describing certain exemplary embodiments with reference to the accompanying drawings, in which.

DETAILED DESCRIPTION OF THE EXEMPLARY EMBODIMENTS

Figure 1:
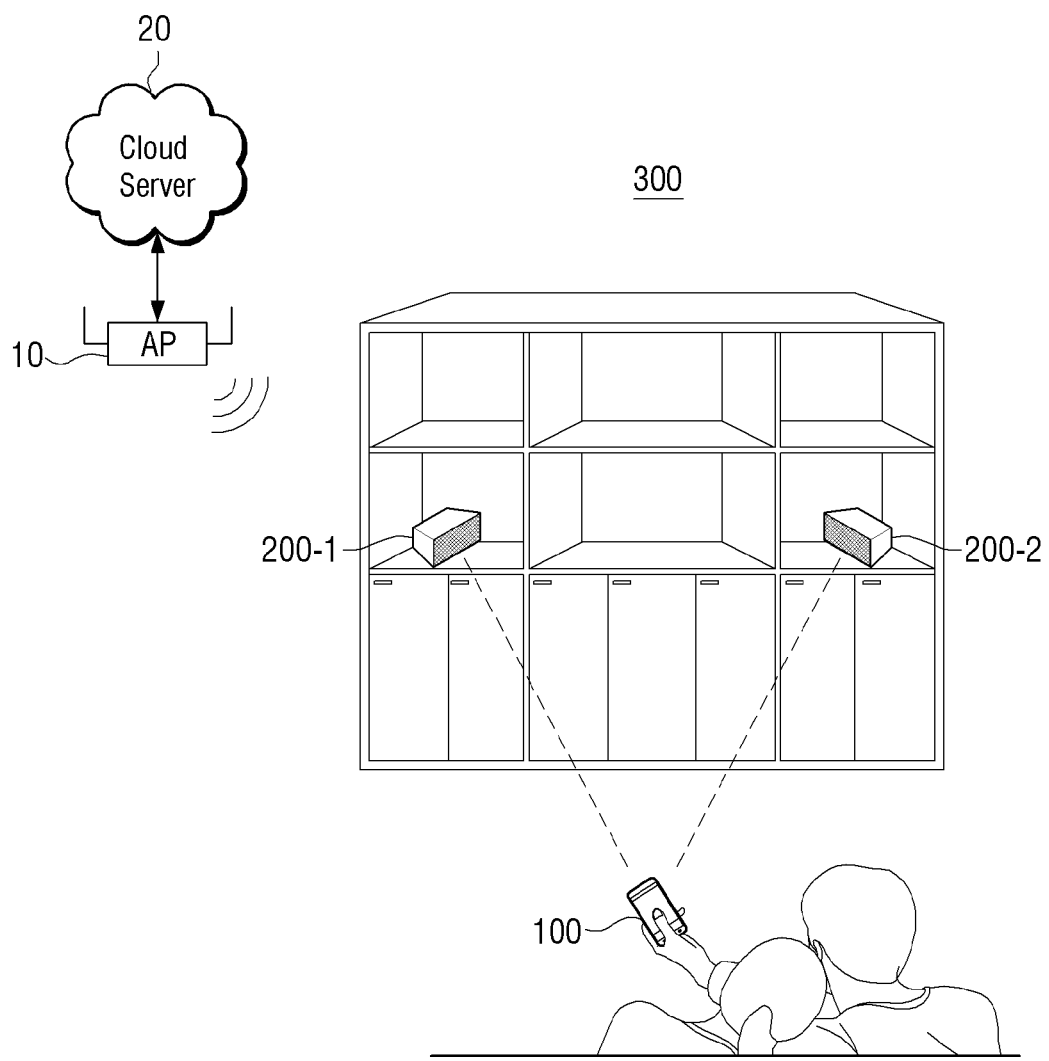
FIG. 1 is a diagram illustrating a structure of a sound output system according to an exemplary embodiment.

As the inventive concept allows for various changes and numerous exemplary embodiments, particular exemplary embodiments will be illustrated in the drawings and described in detail in the written description. However, this is not intended to limit the inventive concept to particular modes of practice. Moreover, all changes, equivalents, and substitutes that do not depart from the spirit and technical scope of the inventive concept are encompassed in the inventive concept. In the description of the exemplary embodiments, certain detailed explanations are omitted when it is deemed that they may unnecessarily obscure the essence of the exemplary embodiments.

The terms such as "first" and "second" are used herein merely to describe a variety of constituent elements, but the constituent elements are not limited by the terms. The terms are used only for the purpose of distinguishing one constituent element from another constituent element.

The singular expressions in the present specification include the plural expressions unless clearly specified otherwise in context. Terms such as "include" or "comprise" may be construed to denote a certain characteristic, number, step, operation, constituent element, or a combination thereof, but are not to be construed to exclude the existence of or a possibility of addition of one or more other characteristics, numbers, steps, operations, constituent elements, or combinations thereof.

Terms, such as 'unit' or 'module', etc., should be understood as a unit that processes at least one function or operation and that may be embodied in a hardware manner, a software manner, or a combination of the hardware manner and the software manner. In addition, a plurality of 'modules' or a plurality of 'units' may be integrated into at least one module to be embodied as at least one processor (not shown) except for a 'module' or a 'unit' that needs to be embodied as a specific hardware.

FIG. 1 is a diagram illustrating a structure of a sound output system 300 according to an exemplary embodiment.

Referring to FIG. 1, the sound output system 300 may include a plurality of speaker apparatuses 200-1 and 200-2 and a user terminal apparatus 100.

Each of the plurality of speaker apparatuses 200-1 and 200-2 may be capable of being connected to an external cloud server 20 through an AP 10, may receive sound source content from the external cloud server 20, and may output the sound source content. In detail, reproduction list information or address information may be pre-registered in each of the plurality of speaker apparatuses 200-1 and 200-2. Accordingly, each of the plurality of speaker apparatuses 200-1 and 200-2 may receive and output the sound source content from the external cloud server 20 based on the pre-registered reproduction list information or address information. The address information or reproduction list information stored in each of the speaker apparatuses 200-1 and 200-2 may be the same or different.

The plurality of speaker apparatuses 200-1 and 200-2 may output the sound source content stored in the external cloud server 20 in a streaming manner, may download and temporally store the sound source content, and may output the temporally stored sound source content sound source content.

In addition, each of the plurality of speaker apparatuses 200-1 and 200-2 may provide device information to the user terminal apparatus 100 through the AP 10 and receive a sound volume adjusting command from the user terminal apparatus 100. Here, the device information may include name information, reproduced content information, current sound volume information, address information, and the like of a speaker apparatus.

In addition, each of the plurality of speaker apparatuses 200-1 and 200-2 may receive the sound volume adjusting command from the user terminal apparatus 100 and output sound source content with a sound volume adjusted according to the received sound volume adjusting command.

The user terminal apparatus 100 may be connected to the AP 10 and may search for the speaker apparatuses 200-1 and 200-2 connected to the AP 10. In addition, the user terminal apparatus 100 may display information of the retrieved speaker apparatuses, may receive selection of a plurality of speakers with an adjusted sound volume among the displayed speaker apparatuses, and receive one-time sound volume adjusting manipulation for the selected plurality of speaker apparatuses.

In detail, the user terminal apparatus 100 may display a first UI element for adjusting a sound volume of each of a plurality of speaker apparatuses and a second UI element for receiving selection of a speaker apparatus, groups the plurality of speaker apparatuses through the second UI element, and receive sound volume adjusting manipulation through a first UI element of any one of the grouped plurality of speaker apparatuses. In addition, the user terminal apparatus 100 may change all first UI elements of the grouped plurality of speaker apparatuses according to the input sound volume adjusting manipulation. Here, the first UI element may be configured with a bar and a moveable pointer on the bar, and the second UI element may be a check box for receiving selection of a speaker apparatus. In an exemplary embodiment, the bar and the moveable pointer may be a slider that includes a slideable button.

In addition, the user terminal apparatus 100 that receives the sound volume adjusting manipulation may transmit a sound volume adjusting command corresponding to the input sound volume adjusting manipulation to a speaker apparatus (or grouped speaker apparatuses) selected by the user. In detail, the user terminal apparatus 100 may transmit the sound volume adjusting command to the speaker apparatus selected by the user through the AP 10 using the address information in the device information.

In this case, the sound volume adjusting command may be a 'value of sound volume to be output' or a 'value indicating adjustment degree'. For example, when a sound volume of a speaker may be displayed as a value of 1 to 100, a current sound volume of a specific speaker is 90, and a sound volume value adjusted by the user is 50, the sound volume adjusting command may be a command indicating that 'change the sound volume to 50' or 'apply −40 to the current sound volume'. A detailed structure and operation of the user terminal apparatus 100 will be described below with reference to FIGS. 2 and 3.

The sound output system 300 according to the above exemplary embodiment may easily adjust sound volumes of a plurality of speaker apparatuses through the user terminal apparatus 100, thereby enhancing user convenience.

Although FIG. 1 illustrates the case in which only two speaker apparatuses are arranged in the sound output system 300, three or more speaker apparatuses may be installed. In addition, although FIG. 1 illustrates that two speaker apparatuses are arranged in one space, the speaker apparatuses may be arranged in spaces that are spaced apart from each other by a wall and placed in different rooms, different structures, etc.

Although FIG. 1 illustrates and describes the case in which a plurality of speaker apparatuses and a user terminal apparatus are wirelessly connected to each other through an AP, the apparatuses may be connected by wire. In addition, although FIG. 1 illustrates and describes the case the plurality of speaker apparatuses and the user terminal apparatus are connected to one AP, the plurality of speaker apparatuses and the user terminal apparatus may be connected to a plurality of APs as long as the apparatuses are connected to one network.

In addition, FIG. 1 illustrates that the AP 10 and the external cloud server 20 are directly connected to each other, other apparatuses such as a router and the Internet may be arranged between the AP 10 and the external cloud server 20.

Figure 2:
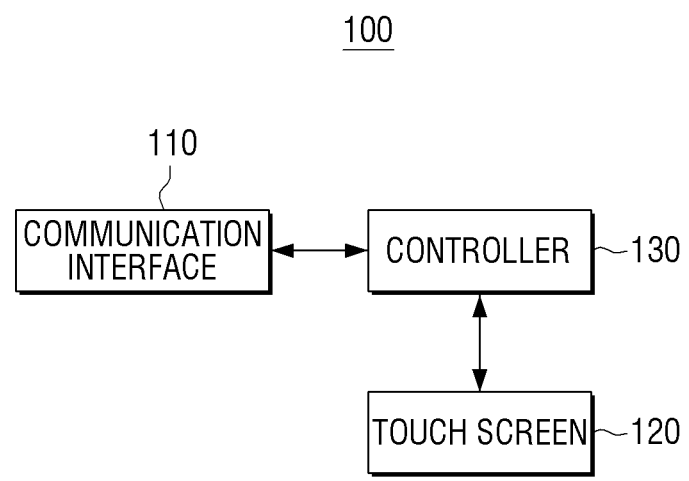
FIG. 2 is a schematic block diagram illustrating a structure of the user terminal apparatus of FIG. 1.

FIG. 2 is a schematic block diagram illustrating a structure of the user terminal apparatus 100 of FIG. 1. In detail, the user terminal apparatus 100 of FIG. 1 may be embodied as various types of apparatuses such as a television (TV), a personal computer (PC), a laptop PC, a portable phone, a tablet PC, a personal digital assistant (PDA), an MP3 player, a kiosk, and an electronic picture frame. When the user terminal apparatus 100 is embodied as a portable type apparatus such as a portable phone, a tablet PC, a PDA, an MP3 player, and a laptop PC, the user terminal apparatus 100 may be referred to as a mobile device but will be collectively referred to as a user terminal apparatus.

Referring to FIG. 2, the user terminal apparatus 100 may include a communication interface 110 (e.g., a communicator, a communication processor, etc.), a touchscreen 120, and a controller 130 (e.g., a processor).

The communication interface 110 may search for a plurality of speaker apparatuses positioned in a network. In detail, the communication interface 110 may search for a speaker apparatuses among electronic devices in a network to which the AP 10 belongs.

In addition, the communication interface 110 may receive apparatus information from a plurality of speaker apparatuses connectable with the user terminal apparatus 100. In detail, the communication interface 110 may receive apparatus information from each retrieved speaker apparatus. Here, the apparatus information may include a name of a speaker apparatus, information of a current sound volume, information of currently reproduced content, IP address information, and so on.

In addition, the communication interface 110 may transmit a sound volume adjusting command to each of the speaker apparatuses 200-1 and 200-2, which is selected by a user. In this case, the sound volume adjusting command may be a 'sound volume value to be output' or a 'value indicating an adjusting degree'. For example, when a sound volume of a speaker is capable of being indicated as a value of 1 to 100, a current sound volume of a specific speaker is 90, and a sound volume adjusted by the user is 50, the sound volume adjusting command may be 'Adjust a sound volume to 50' or 'Apply −40 to a current sound volume'.

The touchscreen 120 may display icons of various applications pre-installed in the user terminal apparatus 100. In addition, the touchscreen 120 may receive selection of any one of the displayed icons of the various applications.

When an icon selected by the user is a speaker application, the touchscreen 120 may display a list of a plurality of speaker apparatuses controllable by the user. In this case, when the user selects any one of the speaker apparatuses, the touchscreen 120 may display apparatus information of a speaker apparatus that outputs the same content as the corresponding speaker apparatus.

According to an exemplary embodiment, the case in which the touchscreen 120 primarily filters and displays only apparatus information of a speaker apparatus that outputs the same content has been described, but in this case, it is assumed that there are a preset number or more connectable speaker apparatuses. That is, in some exemplary embodiments, when there are a preset number or less connectable speaker apparatuses, apparatus information of all connectable speaker apparatuses may be displayed without being filtered. In addition, in some exemplary embodiments, information about apparatuses that output the same content is used as filtering information, but filtering may be previously performed under a different condition such as a place for arrangement of a speaker apparatus, and information about whether a sound source is output.

The touchscreen 120 may display the received apparatus information about the plurality of speaker apparatuses. In detail, the touchscreen 120 may display a user interface window for receiving sound volume adjusting manipulation about the plurality of speaker apparatuses using the apparatus information received through the communication interface 110. The user interface window may include a first region for displaying apparatus information with respect to each of the plurality of speaker apparatuses, a second region for receiving selection of a sound volume adjusting target, a third region for displaying a current sound volume and receiving sound volume adjusting manipulation, a fourth region for receiving selection of a mute command, and so on.

Examples of various interface windows displayable on the touchscreen 120 will be described below with reference to FIGS. 5 to 10.

The touchscreen 120 may receive selection of a plurality of speaker apparatuses with an adjusted sound volume among a plurality of speaker apparatuses. In detail, the touchscreen 120 may receive selection (or grouping) of a second UI element of a speaker apparatuses, a sound volume of which is to be adjusted, among a plurality of second UI elements displayed in the displayed user interface window.

In addition, the touchscreen 120 may receive sound volume adjusting manipulation from the user. In detail, the touchscreen 120 may receive the sound volume adjusting manipulation through any one of a plurality of first UI elements for adjustment of respective sound volumes. The sound volume adjusting manipulation may be a scroll gesture for moving a point on a first UI element and may be input of a number key, a touch gesture of an icon '+' or '−', or the like.

The touchscreen 120 may change and display sound volume information of a speaker apparatus selected by the user according to the sound volume adjusting manipulation input from the user. When the user does not select a speaker apparatus, the touchscreen 120 may change and display only a sound volume of a speaker apparatus that receives the sound volume adjusting manipulation. When the user selects a plurality of speaker apparatuses, upon receiving sound volume adjusting manipulation of one speaker apparatus, the touchscreen 120 may change and display a sound volume of a speaker apparatus that receives the sound volume adjusting manipulation and may simultaneously change and display a sound volume of another speaker apparatus selected by the user. That is, upon receiving sound volume adjusting manipulation through a UI element of any one of a plurality of grouped speaker apparatuses, the touchscreen 120 may change all UI elements of the plurality of grouped speaker apparatuses according to the input sound volume adjusting manipulation.

In addition, upon receiving mute manipulation from the user, the touchscreen 120 may display a sound volume of the speaker apparatus selected by the user as mute. Upon receiving mute manipulation of one of selected speaker apparatuses while the user selects the plurality of speaker apparatuses, the touchscreen 120 may display a sound volume of another speaker apparatus selected by the user as mute as well as the speaker apparatus, mute manipulation of which is input.

Upon receiving one mute manipulation from the user, the touchscreen 120 may change and display sound volume information of the plurality of selected speaker apparatuses as mute.

The controller 130 may control each component in the user terminal apparatus 100. In detail, when the user selects a speaker apparatus, the controller 130 may drive the speaker apparatus. When the speaker application is driven, the controller 130 may control the communication interface 110 to search for connectable speaker apparatuses.

In addition, the controller 130 may control the touchscreen 120 to display apparatus information of the connectable speaker apparatuses. In some exemplary embodiments, the controller 130 may previously display a touchscreen 120 to pre-display a list of connectable speaker apparatuses, receive primary filtering information from the user, and display only apparatus information of a speaker apparatus according to the primary filtering apparatus. Here, the primary filtering apparatus may include an output content type, an arrangement position, whether a sound source is output, whether manipulation is authenticated, and so on.

Upon receiving sound volume adjusting manipulation through the touchscreen 120, the controller 130 may control the communication interface 110 to transmit a sound volume adjusting command corresponding to the sound volume adjusting manipulation to a speaker apparatus selected by the user. When the user selects a plurality of speaker apparatuses prior to the sound volume adjusting manipulation and the sound volume adjusting manipulation of the user is sound volume adjusting manipulation of any one of the plurality of selected speaker apparatuses, the controller 130 may control the communication interface 110 to transmit a sound volume adjusting command corresponding to the sound volume adjusting manipulation to each of the plurality of speaker apparatuses selected by the user.

The controller 130 may control the touchscreen 120 to display a sound volume that is changed according to the sound volume adjusting manipulation.

In addition, upon receiving a sound volume adjusting command through a button that will be described below, the controller 130 may control the touchscreen 120 to change sound volume information according to the received sound volume adjusting command and control the communication interface 110 to transmit the sound volume adjusting command according to the changed sound volume information to the corresponding speaker apparatus.

The user terminal apparatus 100 according to the aforementioned exemplary embodiment may adjust sound volumes of a plurality of speaker apparatuses to be manipulated by the user through one manipulation operation, thereby enhancing user convenience.

Although only simple components constituting a user terminal apparatus have been illustrated and described thus far, various components may be further included in the user terminal apparatus in some exemplary embodiments. This will be described below with reference to FIG. 3.

Figure 3:
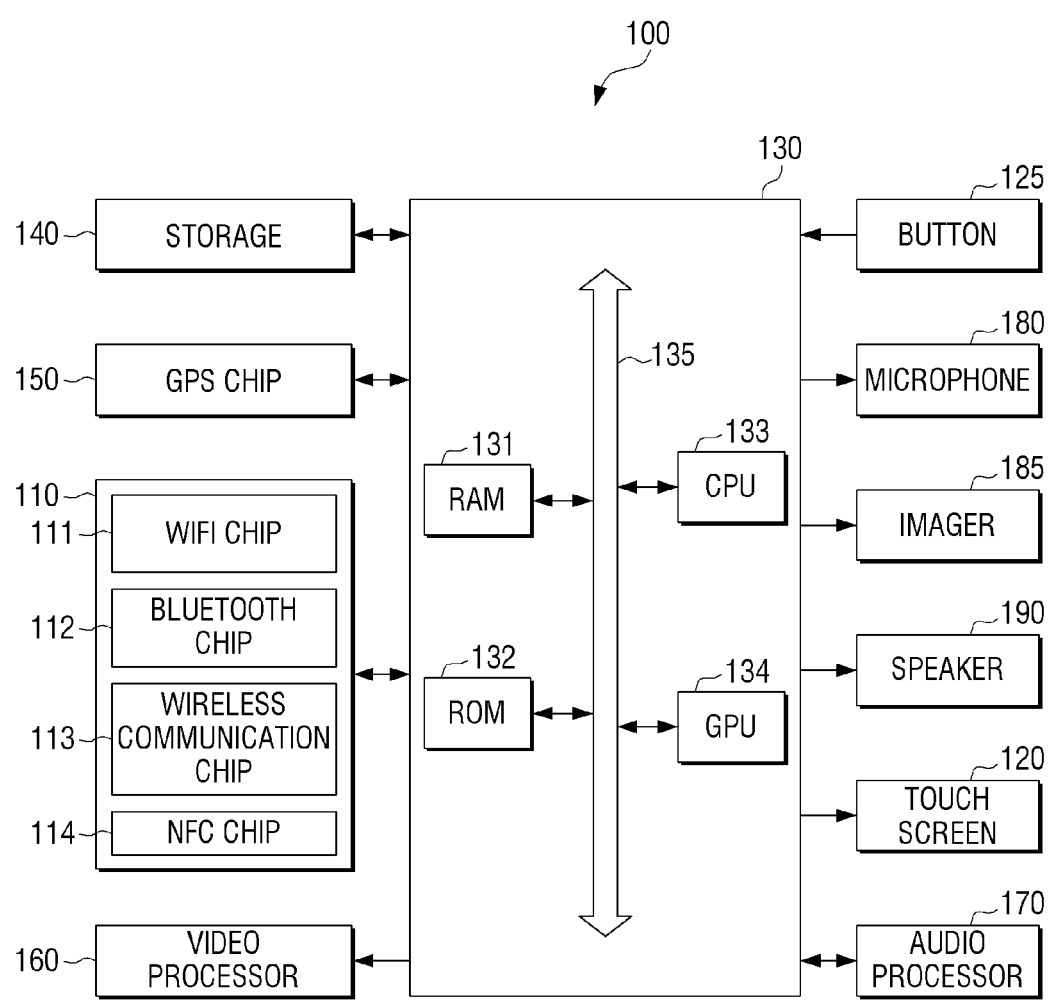
FIG. 3 is a block diagram illustrating detailed components of the user terminal apparatus of FIG. 1.

FIG. 3 is a block diagram illustrating detailed components of the user terminal apparatus 100 of FIG. 1.

Referring to FIG. 3, the user terminal apparatus 100 may include the communication interface 110, the touchscreen 120, the controller 130, a storage 140, a global positioning system (GPS) chip 150, a video processor 160, an audio processor 170, a button 125, a microphone 180, an imager 185, and a speaker 190.

The communication interface 110 may be a component for communicating with various types of external devices using various types of communication methods. The communication interface 110 may include a WiFi chip 111, a Bluetooth chip 112, a wireless communication chip 113, and a near field communication (NFC) chip 114. The controller 130 may communicate with various external devices using the communication interface 110.

The WiFi chip 111 and the Bluetooth chip 112 may perform communication using a WiFi method and a Bluetooth method, respectively. When the WiFi chip 111 or the Bluetooth chip 112 is used, various connection information items such as an SSID and a session key may be previously transmitted, communication is achieved using the connection information, and then various information items may be transmitted and received. The wireless communication chip 113 refers to a chip that performs communication according to various communication standards such as IEEE, ZigBee, $3^{rd}$ generation (3G), $3^{rd}$ generation partnership project (3GPP), and long term evolution (LTE). The NFC chip 114 may refer to a chip that operates in a NFC manner using a frequency band of 13.56 MHz among various RF-ID frequency bands such as 135 kHz, 13.56 MHz, 433 MHz, 860 to 960 MHz, and 2.45 GHz.

As described above, the touchscreen 120 may display information about a speaker apparatus and display a user interface window for receiving sound volume adjusting manipulation. The touchscreen 120 may be embodied as various types of displays such as a liquid crystal display (LCD), an organic light emitting diode (OLED) display, and a plasma display panel (PDP). The touchscreen 120 may also include a driving circuit embodied in the form of an a-si TFT, a low temperature poly silicon (LTPS) TFT, or an organic TFT (OTFT), a backlight unit, or the like. In addition, the touchscreen 120 may be embodied as a flexible display.

The touchscreen 120 may include a touch sensor for detection of a touch gesture. The touch sensor may be embodied as various types of sensors such as an electrostatic sensor, a resistive sensor, and a piezoelectric sensor. The electrostatic sensor may detect micro electricity excited to a body of a user and calculate a touch coordinate using a dielectric substance coated on a touchscreen surface when the touchscreen surface is touched by a body part of the user. The resistive sensor may include two electrode plates installed in a touchscreen, and may detect that upper and lower plates of a touched point contact each other such that current flows and calculate a touch coordinate when a user touches a screen. In addition, when the user terminal apparatus 100 supports a pen input function, the touchscreen 120 may detect a user gesture using an input element such as a pen as well as a user finger. When the input element is a stylus pen including a coil installed therein, the user terminal apparatus 100 may include a magnetic field detecting sensor for detection of a magnetic field that is changed by the coil in the stylus pen. Accordingly, a proximity gesture, that is, hovering as well as a touch gesture may be detected.

Although the case in which one touchscreen 120 performs both the display function and the detection function of the touch gesture has been described thus far, in some exemplary embodiments, the display function and the gesture detection function may be performed by different components. That is, a display apparatus that is only capable of displaying an image and a touch panel that is only capable of detecting touch may be combined to embody the touchscreen 120.

The storage 140 may store various programs and data required for an operation of the user terminal apparatus 100. In detail, the storage 140 may store a program, data, and the like for configuring various UIs constituting a user interface window. In addition, the storage 140 may store apparatus information of a speaker apparatus, which is received through the communication interface 110.

In addition, the storage 140 may store a plurality of applications. Here, at least one application may be a speaker application for the operation according to an exemplary embodiment.

The controller 130 may display a user interface window on the touchscreen 120 using the program and data stored in the storage 140. In addition, when a user touch is performed on a specific region of the user interface window, the controller 130 may perform a control operation corresponding to the user touch.

The controller 130 may include a RAM 131, a ROM 132, a CPU 133, a graphic processing unit (GPU) 134, and a bus 135. The RAM 131, the ROM 132, the CPU 133, the GPU 134, and so on may be connected to each other a bus 135.

The CPU 133 may access the storage 140 and perform booting using an operating system (O/S) stored in the storage 140. In addition, the CPU 133 may perform various operations using various programs, contents, data items, and so on which are stored in the storage 140.

The ROM 132 may store a command set, and the like for system booting. When a turn-on command is input to supply power, the CPU 133 may copy the O/S stored in the storage 140 to the RAM 131 according to a command stored in the ROM 132 and execute the O/S to boot a system. When booting is completed, the CPU 133 may copy various programs stored in the storage 140 to the RAM 131 and execute the programs copied to the RAM 131 to perform various operations.

When booting of the user terminal apparatus 100 is completed, the GPU 134 may display a UI on a touchscreen 120. In detail, the GPU 134 may generate an image containing various objects such as an icon, an image, and a text using a calculator (not shown) and a renderer (not shown). The calculator may calculate an attribute value such as a coordinate value, a shape, a size, color, etc. for displaying objects according to a layout of a screen. The renderer may generate various layouts of images including an object based on the attribute value calculated by the calculator. The image (or a user interface window) generated by the renderer may be provided to the touchscreen 120 and may be displayed in a main display region and a sub display region.

The GPS chip 150 may be a component for receiving a GPS signal from a GPS (global positioning system) satellite and calculating a current position of the user terminal apparatus 100. The controller 130 may calculate a position of a user using the GPS chip 150 when a navigation program is used or a current position of the user is required.

The video processor 160 may be a component for processing video data containing in content received from the communication interface 110 or content stored in the storage 140. The video processor 160 may perform various image processing processes such as decoding, scaling, noise filtering, frame rate conversion, and resolution conversion on audio data.

The audio processor 170 may be a component for processing audio data contained in content received through the communication interface 110 or content stored in the storage 140. The audio processor 170 may perform various processing processes such as decoding, amplification, and noise filtering on the audio data.

When a reproduction application for multimedia content is executed, the controller 130 may drive the video processor 160 and the audio processor 170 to reproduce corresponding content. The touchscreen 120 may display an image frame generated by the video processor 160 on at least one of a main display region and a sub display region.

The speaker 190 may output audio data generated by the audio processor 170.

The button 125 may be various types of buttons such as a mechanical button, a touchpad, and a wheel, formed on an arbitrary region such as a front portion, a lateral portion, and a bottom portion of an external surface of a main body of the user terminal apparatus 100. The button 125 may include a button '+' 125-2 disposed on the lateral portion of the external surface of the main body and for receiving a command for increasing a sound volume, and a button '−' for receiving a command for reducing a sound volume, which will be described with reference to FIG. 10.

The microphone 180 may be a component for receiving user voice or other sounds and converting the received sound into audio data. The controller 130 may use the user voice input through the microphone 180 during a call process or convert the user voice into audio data and store the audio data in the storage 140. The microphone 180 may include a plurality of stereo microphones for receiving sound from a plurality of positions.

The imager 185 may be a component that captures a still or video image according to user control. The imager 185 may be embodied as a plurality of cameras such as a front camera and a rear camera. As described above, the imager 185 may be used as an element for acquisition of a user image in an exemplary embodiment for gaze track of the user.

When the imager 185 and the microphone 180 are provided, the controller 130 may perform a control operation according to user voice input through the microphone 180 or a user motion recognized by the imager 185. That is, the user terminal apparatus 100 may operate in a motion control mode or a voice control mode. When the user terminal apparatus 100 operates in a motion control mode, the controller 130 may activate the imager 185 to photograph a user and may track change in a user motion and perform a control operation corresponding to the track change. When user terminal apparatus 100 operates in a voice control mode, the controller 130 may analyze the user voice input through the microphone 180 and operate in a voice recognition mode for performing a control operation according to the analyzed user voice.

In the user terminal apparatus 100 that supports a motion control mode or a voice control mode, voice recognition technologies or motion recognition technologies may be used in the aforementioned various exemplary embodiments. For example, when the user makes a gesture of selecting an object displayed on a home image or pronounce a voice command corresponding to the object, the user terminal apparatus 100 may determine that the corresponding object is selected and perform a control operation matched to the object.

In addition, although not illustrated in FIG. 3, in some exemplary embodiments, the user terminal apparatus 100 may further include a USB port to which a USB connector is connectable, various external input ports for connection of various external terminals such as a headset, a mouse, and a LAN, a DMB chip for receiving and processing a digital multimedia broadcasting (DMB) signal, various sensors, and so on.

As described above, the storage 140 may store various programs.

Figure 4:
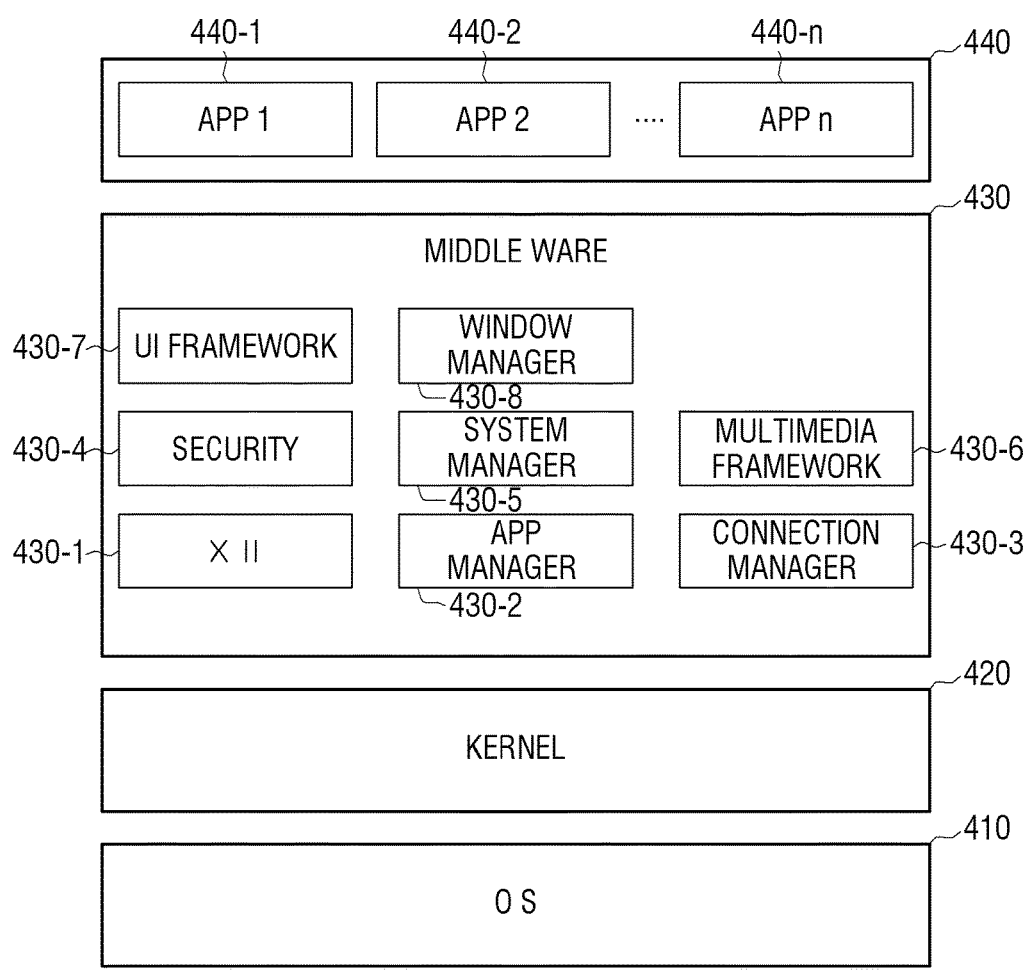
FIG. 4 is a diagram for explanation of a structure of software stored in a user terminal apparatus.

FIG. 4 is a diagram for explanation of a structure of software stored in the user terminal apparatus 100. Referring to FIG. 4, the storage 140 may store software containing an OS 410, a kernel 420, middleware 430, applications 440, and so on.

The OS 1210 may control and manages an overall operation of hardware. That is, the OS 410 may be a layer that is responsible for a basic function such as hardware management, memory, and security.

The kernel 420 may function as a path for transmitting various signals as well as a touch signal detected by the touchscreen 120 to the middleware 430.

The middleware 430 may include various software modules for controlling an operation of the user terminal apparatus 100. In detail, the middleware 430 may include an X11 module 430-1, an APP manager 430-2, a connection manager 430-3, a security module 430-4, a system manager 430-5, a multimedia framework 430-6, a UI framework 430-7, a window manager 430-8, and so on.

The X11 module 430-1 may be a module for receiving various event signals from various hardware items included in the user terminal apparatus 100. Here, the event may be variously set as an event for detection of a user gesture, an event for moving the user terminal apparatus 100 in a specific direction, an event of system alarm, an event for executing or terminating a specific program, and so on.

The APP manager 430-2 may be a module for managing an execution state of the various applications 440 installed in the storage 140. Upon detecting an application execution event from the X11 module 430-1, the APP manager 430-2 may call and execute an application corresponding to the corresponding event. For example, when an icon of a user speaker application is selected, the APP manager 430-2 may call and execute the speaker application.

The connection manager 430-3 may be a module for supporting wired or wireless network connection. The connection manager 430-3 may include various detailed modules such as a DNET module, a UPnP module, and so on. In detail, when the speaker application is executed, the connection manager 430-3 may search for a speaker apparatus in the AP 10.

The security module 430-4 may be a module for supporting certification for hardware, request permission, secure storage, and so on.

The system manager 430-5 may monitor states of various components in the user terminal apparatus 100 and provide the monitoring result to other modules. For example, when power remaining in a battery is insufficient, errors occur, or communication is disconnected, the system manager 430-5 may provide the monitoring result to the UI framework 430-7 to output a notification message or a notification sound.

The multimedia framework 430-6 may be a module for reproducing multimedia content stored in the user terminal apparatus 100 or provided from an external source. The multimedia framework 430-6 may include a player module, a camcorder module, a sound processing module, and so on. Accordingly, the multimedia framework 430-6 may perform an operation for reproducing various multimedia contents and generating and reproducing an image and sound.

The UI framework 430-7 may be a module for providing various UIs to be displayed on the touchscreen 120. The UI framework 430-7 may include an image compositor module for composing various objects, a coordinate combination module for calculating a coordinate for displaying an object, a rendering module for rendering the composed object at the calculated coordinate, and a 2D/3D UI tool kit for providing a tool for configuration of a 2D or 3D form of UI.

The window manager 430-8 may detect a touch event or other input events using a user body or a pen. Upon detecting the event, the window manager 430-8 may transmit an event signal to the UI framework 430-7 and perform an operation corresponding to the event.

In addition, the window manager 430-8 may store various program modules such as a writing module for drawing a line according to a drag trajectory when a user touches and drags an image, or an angle calculating module for calculating a pitch angle, a roll angle, a yaw angle, and the like based on a sensor value detected by a gyro sensor of the user terminal apparatus 100.

The application module 440 may include applications 440-1 to 440-$n$ for supporting various functions. For example, the application module 440 may include an application module for providing various services such as a speaker application module, a navigation application module, a game module, an e-book program, a calendar program, and an alarm management program. The applications may be installed as default or may be arbitrarily installed or used by the user during use. When an icon object of a user interface window is selected, the CPU 133 may execute an application corresponding to the selected icon object using the application module 440.

The software structure illustrated in FIG. 4 is merely an example and thus is not limited thereto. Accordingly, as necessary, some components may be omitted or modified or other components may be added. For example, the storage 140 may further include various programs such as a sensing module for sensing signals sensed by various sensors, a messaging module such as a messenger program, a short message service (SMS) & multimedia message service (MMS) program and an e-mail program, a call info aggregator program module, a VoIP module, and a web browser module.

As described above, the user terminal apparatus 100 may be embodied as various types of apparatuses such as a portable phone, a tablet personal computer (PC), a laptop PC, a personal digital assistant (PDA), an MP3 player, an electronic picture frame, a television (TV), a PC, and a kiosk. Accordingly, the components described with reference to FIGS. 2 and 3 may be modified in various forms according to a type of the user terminal apparatus 100.

As described above, the user terminal apparatus 100 may be embodied in various forms and configurations. The controller 130 of the user terminal apparatus 100 may support various user interactions, in some exemplary embodiments.

Hereinafter, examples of a user interface window for providing various user interactions will be described with regard to various exemplary embodiments.

When a user drives a speaker application, the touchscreen 120 may display a list of speaker apparatuses present in a network. In this case, the touchscreen 120 may display only simple information such as a name of an apparatus among received information items in order to display many speaker apparatuses.

Figure 5:
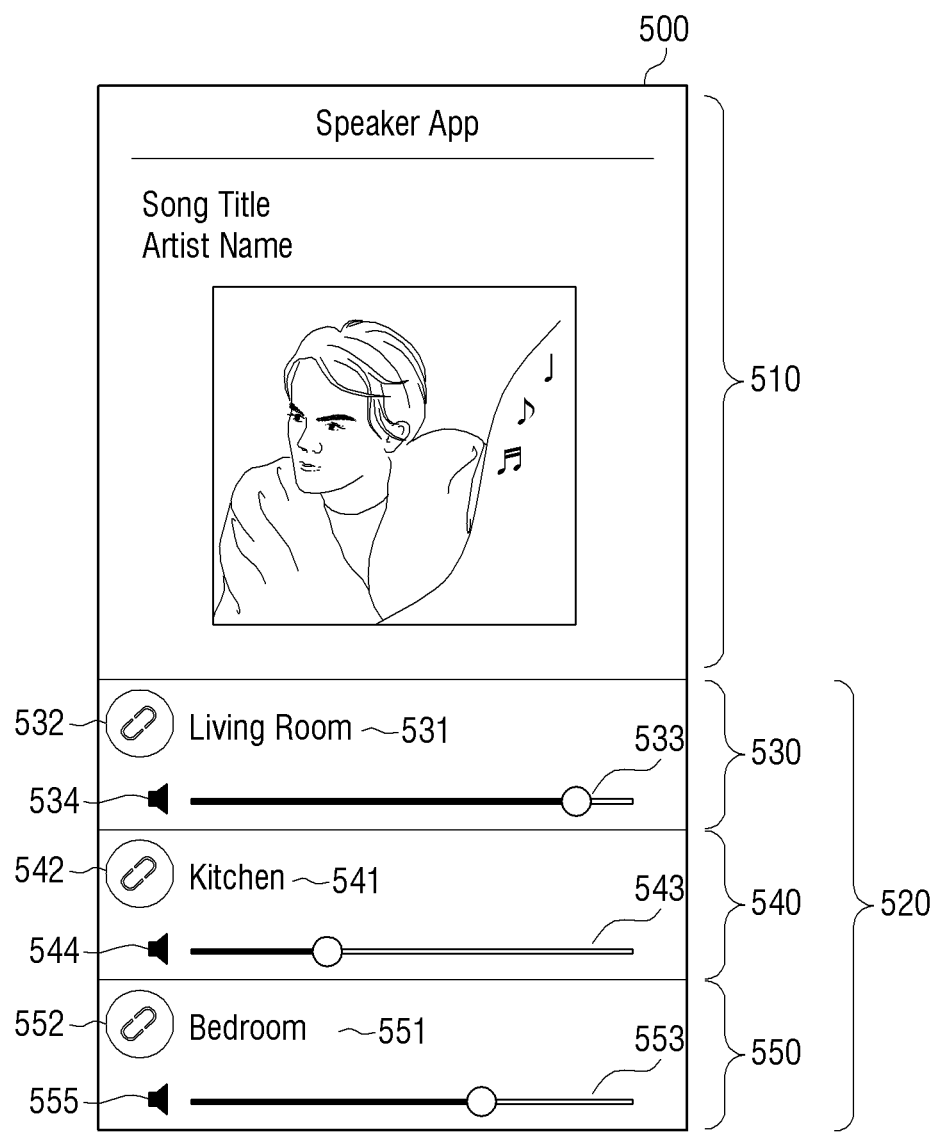
FIGS. 5 to 10 are diagrams illustrating examples of a user interface window displayable on a display illustrated in FIG. 2.

When one speaker apparatus is selected on the display image, a touchscreen may display information of a plurality of speaker apparatuses for reproducing the same content as the corresponding speaker apparatus and the user interface window illustrated in FIG. 5 for adjusting sound volumes of the corresponding plurality of speaker apparatuses.

When there are a preset number of less connectable speaker apparatuses or a user does not set the aforementioned filtering condition, a speaker application may be driven and simultaneously the user interface window illustrated in FIG. 5 may be immediately displayed.

FIGS. 5 to 10 are diagrams illustrating examples of a user interface window displayable on a display illustrated in FIG. 2.

In detail, FIG. 5 illustrates an example of a user interface window for displaying speaker information.

Referring to FIG. 5, a user interface window 500 may include a content information display region 510 and an apparatus information display region 520.

The content information display region 510 may be a region for displaying a fourth UI element corresponding to information of content that is currently displayed by a plurality of speaker apparatuses. The fourth UI element may be an image such as a song title thumbnail, an artist thumbnail, and the like of sound source content. When a plurality of speaker apparatuses output different contents, the content information display region 510 may not be displayed.

The apparatus information display region 520 may be a region for displaying apparatus information of connectable speaker apparatuses and may include a first region 531, 541, and 551 for displaying apparatus information of a corresponding speaker apparatus, a second region 532, 542, and 552 for receiving selection of a sound volume adjusting target, a third region 533, 543, and 553 for displaying a current sound volume and receiving sound volume adjusting manipulation, and a fourth region 534, 544, and 555 for receiving a mute command.

The apparatus information display region 520 may be made up of one volume adjusting region (not shown) to control a volume of all connectable or connected speaker apparatuses. Moreover, the apparatus information display region 520 may be made up of a plurality of volume adjusting control regions 530, 540 and 550. The apparatus information display region 520 may be toggled between the one volume adjusting region (not shown) and the plurality of volume adjusting control regions 530, 540 and 550 by selecting another user interface element (not shown) for toggling between the different interfaces for adjusting the volume of the plurality of speakers.

The first region 531, 541, and 551 may be a region for displaying apparatus information of a speaker apparatus and may display place information for positioning a speaker apparatus, a speaker apparatus name, a nickname, and so on.

The second region 532, 542, and 552 may be a region for selection of a sound volume adjusting target and may display a second UI element for receiving a speaker apparatus. The second UI element may be a check box or a radio button for receiving selection from a user and may be displayed in various forms such as a circular shape as well as a general quadrangular box shape. The user may select the corresponding second UI element to select (or group) a plurality of speaker apparatuses, sound volumes of which are to be adjusted.

The third region 533, 543, and 553 may be a region for receiving sound volume adjusting manipulation and may display a first UI element for adjusting respective sound volumes of speaker apparatuses. As illustrated in FIG. 5, the first UI element may be configured as a bar and a pointer moveable on the bar and a position of the pointer on the bar may indicate a current sound volume of a speaker apparatus. Accordingly, the user may change the position of the pointer on the bar to adjust a sound volume.

The fourth region 534, 544, and 554 may be a region for receiving a mute command and may display a third UI element for receiving the mute command. The third UI element may have an icon shaped like a speaker, and when a user selects the corresponding icon, the icon may be changed to an icon indicating that speaker output is limited. The user may select a corresponding third UI element to input a mute command.

When the user interface window 500 is displayed, the user may check that sound volumes of a kitchen and a bedroom are low and want to adjust the sound volumes of the kitchen and the bedroom. In this case, the user may touch the second region 542 and 552 of the corresponding two speaker apparatuses 540 and 550. Upon receiving the touch, the user interface window may be displayed as illustrated in FIG. 6.

Figure 6:
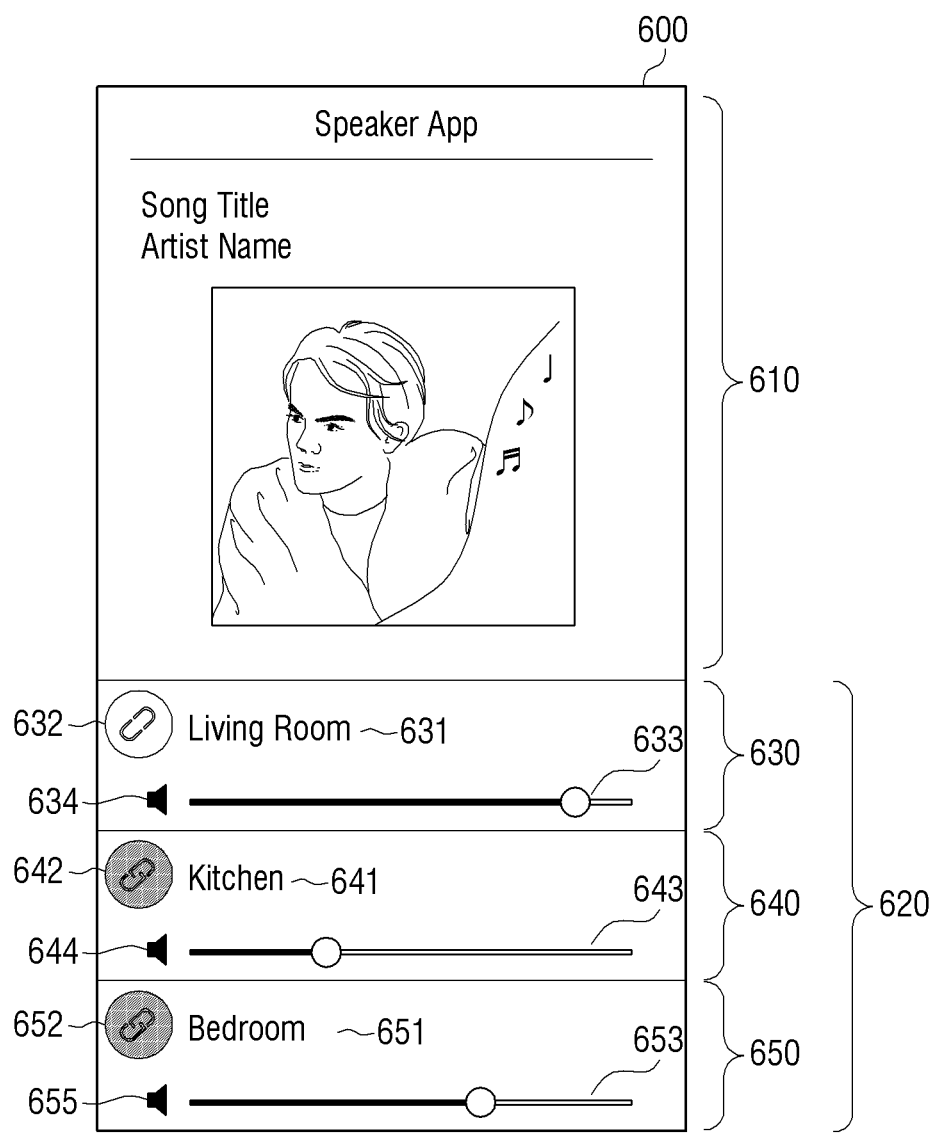

FIG. 6 is a diagram illustrating an example of a displayable user interface window 600 when a user selects a plurality of speaker apparatuses.

Referring to FIG. 6, the user interface window 600 may include a content information display region 610 and an apparatus information display region 620.

The content information display region 610 may be a region for displaying information of content that is currently displayed by a plurality of speaker apparatuses.

The apparatus information display region 620 may be a region for displaying apparatus information of a plurality of connectable speaker apparatuses and may include a first region 631, 641, and 651, a second region 632, 642, and 652, a third region 633, 643, and 653, and a fourth region 634, 644, and 655, like in FIG. 5.

Since the user selects the second region 542 and 552 in the previous process, the second region 642 and 652 of FIG. 6 may display an icon indicated to be selected by the user or display different color from the second region 542 and 552 of FIG. 5.

When the user interface window 600 is displayed, the user may adjust a sound volume using a first UI of the third region 653 of a speaker apparatus 650 positioned in a bedroom. In detail, the user may move a pointer on the first UI element of the third region 653 to the right from the left to adjust a sound volume in order to increase a sound volume. When the user inputs a scroll gesture, a user interface window illustrated in FIG. 7 may be displayed.

When the user interface window 600 is displayed, the user may intend to adjust a sound volume of a speaker apparatus 630 positioned in a living room instead of speaker apparatuses 640 and 650 positioned in a pre-selected bedroom or kitchen. In this case, the user may adjust a sound volume using the third region 633 of the speaker apparatus 630 positioned in a living room. In this case, the controller 130 may transmit a sound volume adjusting command only to the speaker apparatus 630 positioned in a living room.

Figure 7:
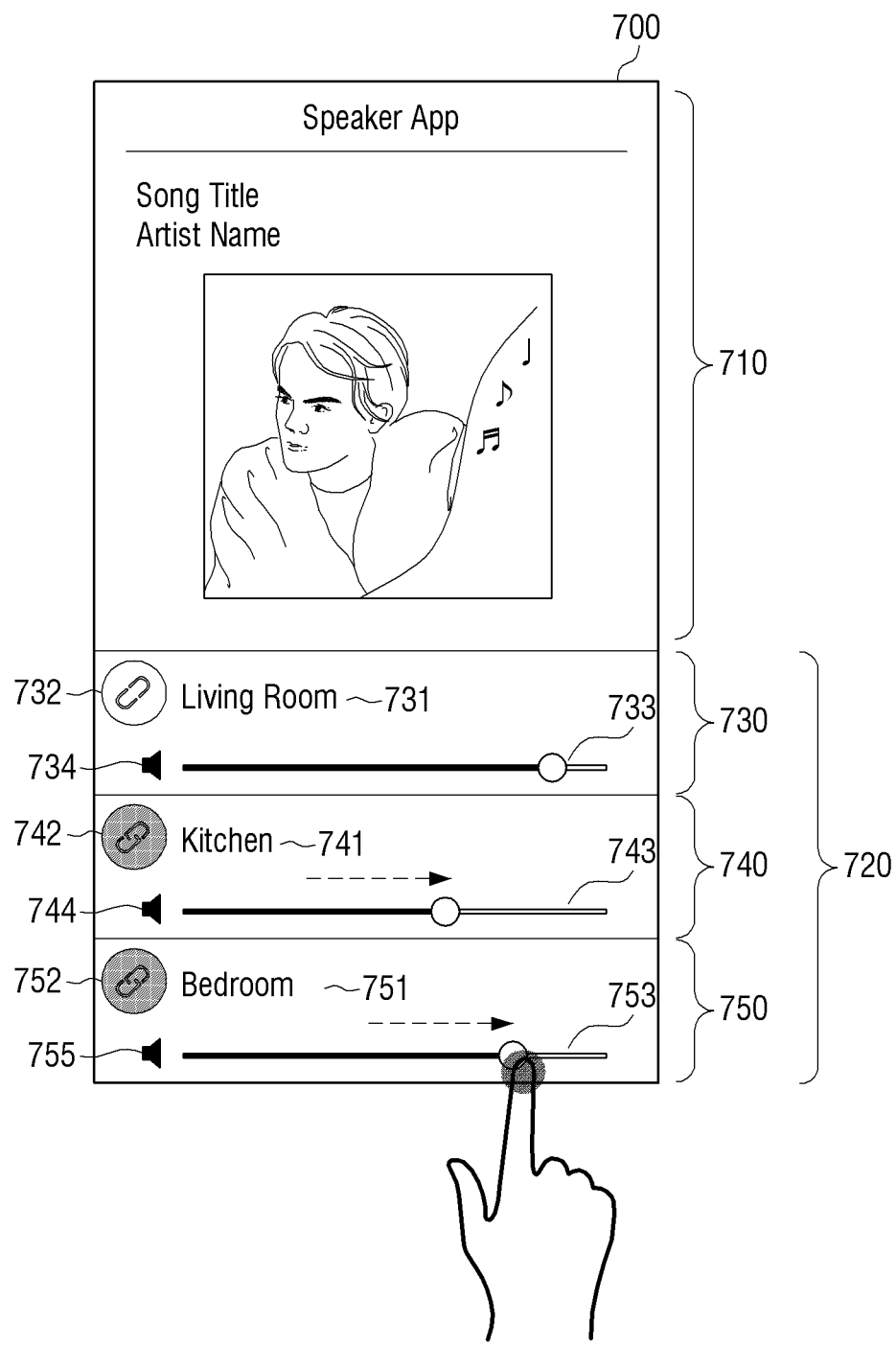

FIG. 7 is a diagram illustrating an example of a displayable user interface window 700 when a user receives one sound volume adjusting manipulation operation.

Referring to FIG. 7, in the user interface window 700, a content information display region 710 and an apparatus information display region 720 are displayed.

The content information display region 710 may be a region for displaying information of content that is currently displayed by a plurality of speaker apparatuses.

The apparatus information display region 720 may be a region for displaying apparatus information of connectable speaker apparatuses and may include a first region 731, 741, and 751, a second region 732, 742, and 752, a third region 733, 743, and 753, and a fourth region 734, 744, and 755, like in FIG. 5.

Since the user adjusts a sound volume using the third region 653 of the speaker apparatus 650 in the previous process, the first UI element of the third region 653 of the speaker apparatus 650 positioned in a bedroom may be displayed with a sound volume that is adjusted to correspond to a moving distance of a scroll gesture of the user. In addition, the first UI element of the third region 643 of the speaker apparatus 640 positioned in a kitchen may also be displayed with a sound volume that is adjusted to correspond to a moving distance of a scroll gesture of the user. In this case, the controller 130 may transmit a sound volume adjusting command corresponding to a changed sound volume to a speaker apparatus 750 positioned in a bedroom and a speaker apparatus 740 positioned in a kitchen.

When the user interface window 700 is displayed, the user may want to adjust sound volumes of all speaker apparatuses including that of a living room. In this case, the user may further select a speaker apparatus 732 of a living room, which is not selected by the user, and may move a pointer of a first UI element of a third region 733 to adjust a sound volume in order to reduce sound volumes of all speaker apparatuses. When such manipulation is performed, a user interface window of FIG. 8 may be displayed.

When the user interface window 600 is displayed, the user may want to mute sound volumes of speaker apparatuses positioned in a bedroom and a kitchen. In this case, the user may input a touch gesture for a fourth region 955 to adjust a sound volume as mute in order to mute sound volumes of the bedroom and the kitchen. When such manipulation is performed, a user interface window of FIG. 9 may be displayed.

Figure 8:
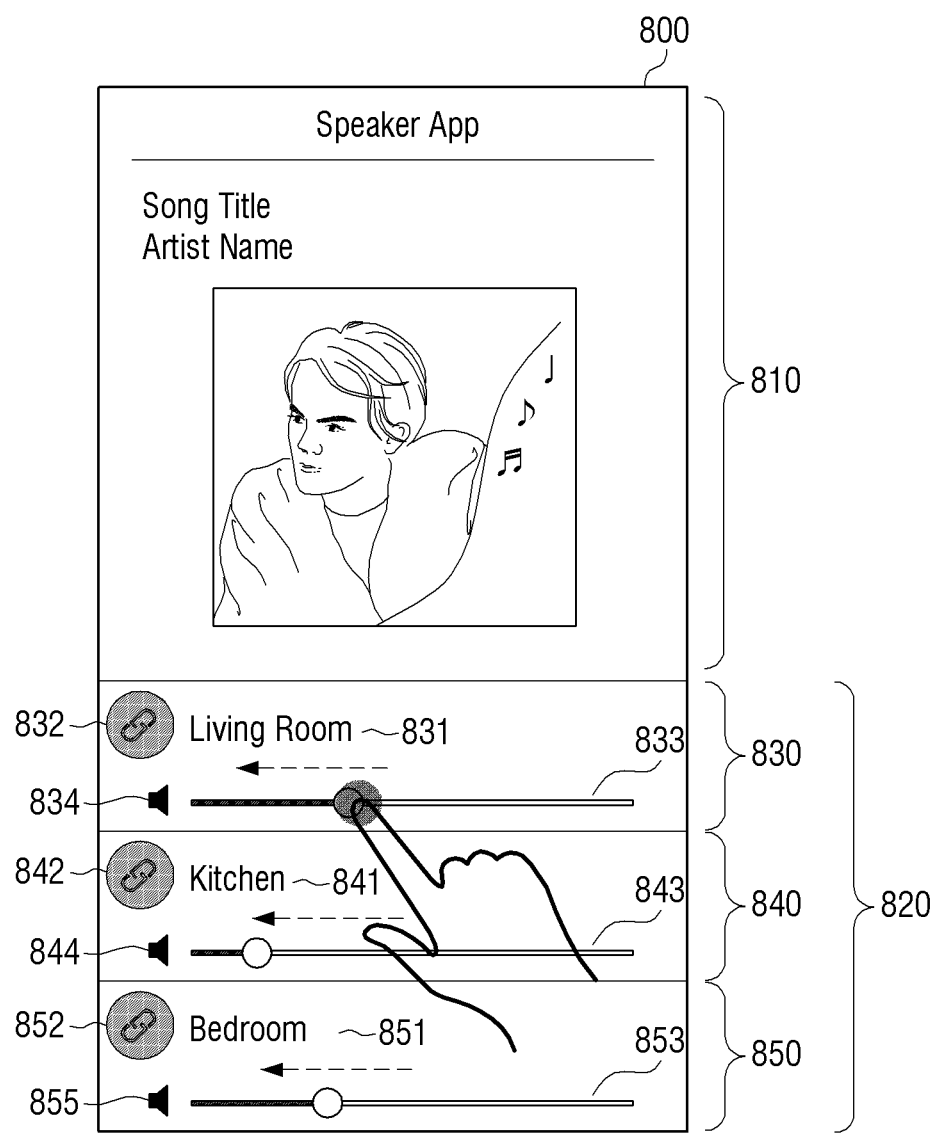

FIG. 8 is a diagram illustrating an example of a displayable user interface window 800 when a user receives one sound volume adjusting manipulation operation.

Referring to FIG. 8, the user interface window 800 may include a content information display region 810 and an apparatus information display region 820.

The content information display region 810 may be a region for displaying information of content that is currently displayed by a plurality of speaker apparatuses.

The apparatus information display region 820 may be a region for displaying apparatus information of connectable speaker apparatuses and may include a first region 831, 841, and 851, a second region 832, 842, and 852, a third region 833, 843, and 853, and a fourth region 834, 844, and 855, like in FIG. 5.

Since the user further selects a speaker apparatus 730 of a living room in the previous process, the second region 832, 842, and 852 of FIG. 8 may display an icon indicated to be pre-selected by the user or display different color from the second region of FIG. 5.

In addition, since the user inputs sound volume adjustment using a first UI element of the third region 733, the third region 833 may change and display a sound volume state displayed to corresponding to a scroll gesture of the user. In addition, since a speaker apparatus 840 positioned in a kitchen and a speaker apparatus 830 positioned in a bedroom are pre-selected, first UI elements of the third regions 843 and 853 of the speaker apparatus 840 positioned in the kitchen and a speaker apparatus 850 positioned in a bedroom may also be displayed with a pointer on the first UI element, which is changed to correspond to a scroll gesture of a user. In this case, changed sizes of the third regions 843 and 853 (i.e., a moving distance of a pointer) may be the same as a changed size of the third region 833 (i.e., a moving distance of a pointer).

Although only the example in which a sound volume is adjusted through the third region 833, 843, and 853 has been described, sound volume adjustment may also be received through a button as well as through a touchscreen. This example will be described below with reference to FIG. 10.

Figure 9:
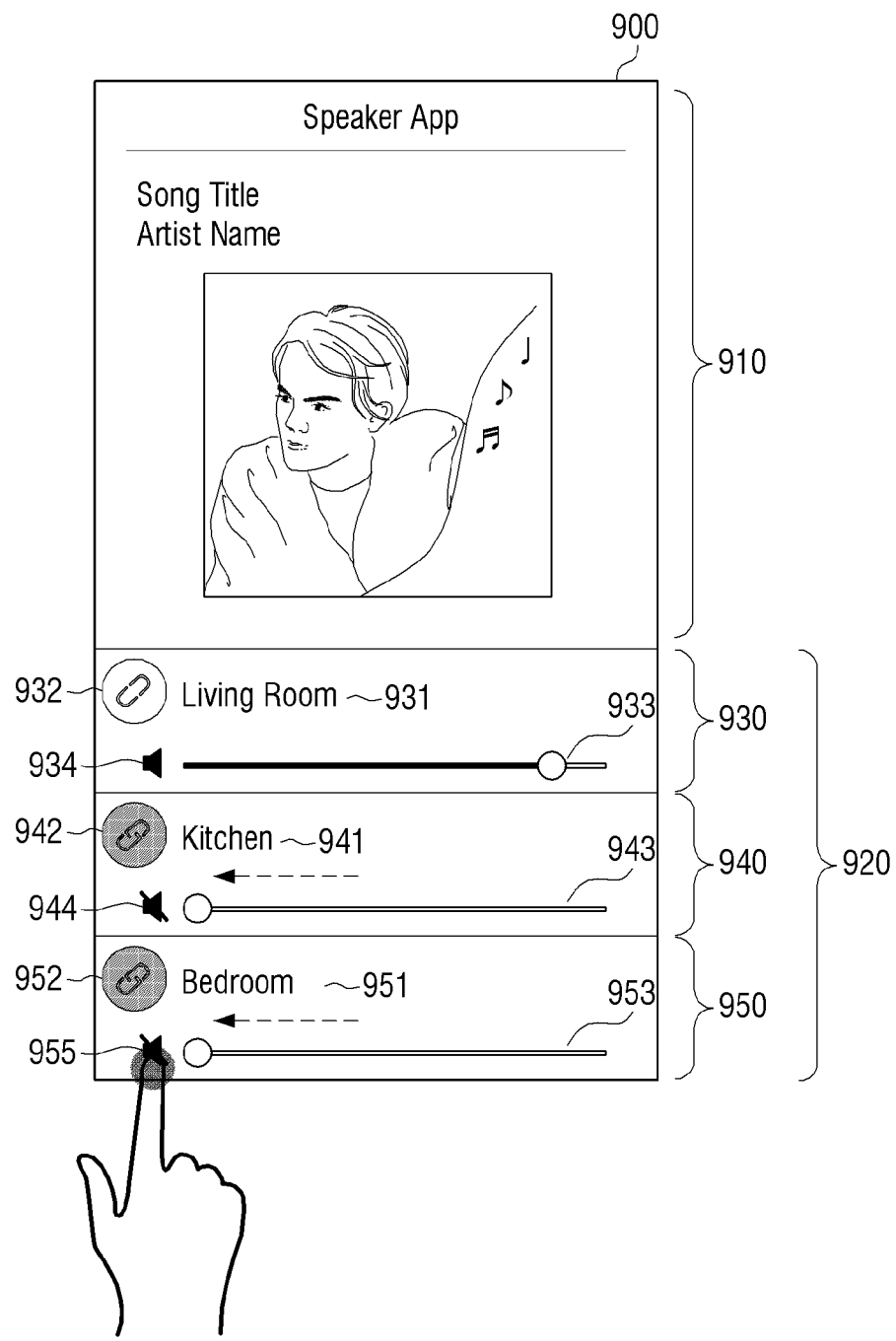

FIG. 9 illustrates an example of a displayable user interface window when a user receives one mute manipulation operation.

Referring to FIG. 9, a user interface window 900 may include a content information display region 910 and an apparatus information display region 920.

The content information display region 910 may be a region for displaying information of content that is currently displayed by a plurality of speaker apparatuses.

The apparatus information display region 920 may be a region for displaying apparatus information of connectable speaker apparatuses and may include a first region 931, 941, and 951, a second region 932, 942, and 952, a third region 933, 943, and 953, and a fourth region 934, 944, and 955, like in FIG. 5.

Since the user selects the second region 742 and 752 in the previous process, the second region 742 and 752 of FIG. 9 may display an icon indicated to be pre-selected by the user or display different color from the second region of FIG. 5.

In addition, since the user inputs a mute command using the fourth region 955, the fourth region 955 positioned in a bedroom may display a third UI element indicating mute and the third region 953 of a speaker apparatus 950 may also display a third UI element indicating that a sound volume state of the third region 953 is 0. In addition, since a speaker apparatus 940 positioned in a kitchen is pre-selected, a fourth region 945 of the speaker apparatus 940 positioned in a kitchen may display a third UI element indicating mute and a third region 943 may also display a third UI element indicating that a sound volume is muted.

Figure 10:
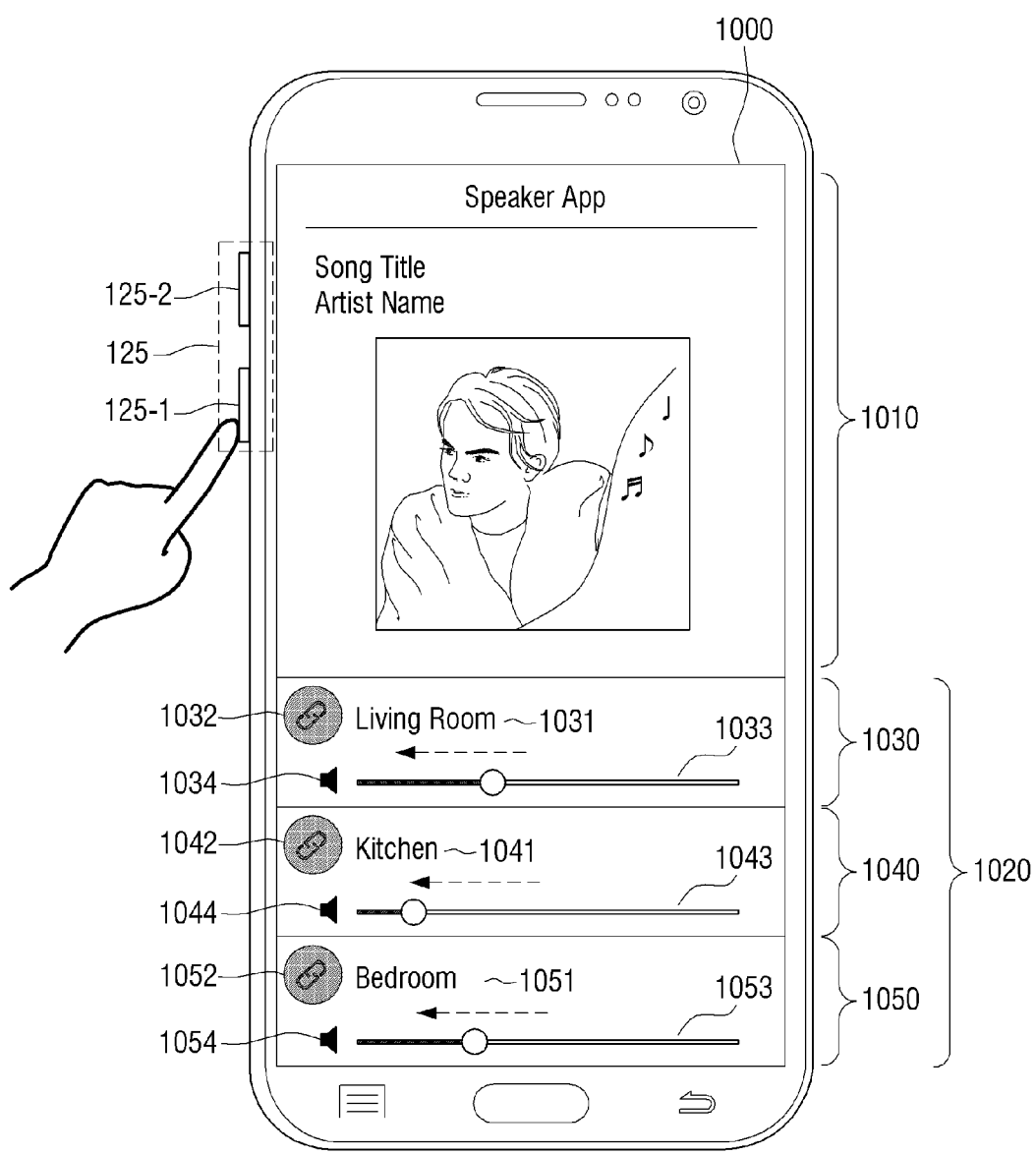

FIG. 10 is a diagram illustrating an example of a displayable user interface window when a user receives one sound volume adjusting manipulation operation.

Referring to FIG. 10, a user interface window 1000 may include a content information display region 1010 and an apparatus information display region 1020.

The content information display region 1010 may be a region for displaying information of content that is currently displayed by a plurality of speaker apparatuses.

The apparatus information display region 1020 may be a region for displaying apparatus information of connectable speaker apparatuses and may include a first region 1031, 1041, and 1051, a second region 1032, 1042, and 1052, a third region 1033, 1043, and 1053, and a fourth region 1034, 1044, and 1054, like in FIG. 5.

Since the user selects three speaker apparatuses in the previous process, the second region 1032, 1042, and 1052 of FIG. 10 may display a second UI element indicated to be pre-selected by the user.

In addition, since the user manipulates a '−' button 125-1 of the sound volume adjusting button 125 disposed in a lateral surface of the user terminal apparatus 100, first UI elements of third regions 1033, 1044, and 1053 of the three pre-selected speaker apparatuses 1030, 1040, and 1050 may be displayed with a sound volume state that is changed to correspond to a number of times or length of button selection. In this case, the controller 130 may transmit a sound volume adjusting command for reducing a sound volume to the three speaker apparatuses.

In FIGS. 5 to 10, a separate integrated sound volume adjusting region may not be displayed on a user interface window. In detail, conventionally, an integrated sound volume adjusting region for adjusting sound volumes of a plurality of speaker apparatuses is disposed on a user interface window, and thus when the integrated sound volume adjusting region is used, all of a plurality of connectable speaker apparatuses may be simply and collectively adjusted, but only a speaker apparatus desired by the user may not be adjusted.

However, even if a user interface window according to the exemplary embodiment does not use a separate integrated sound volume adjusting region, the user may select a speaker apparatus to be easily adjusted using a second region and adjust sound volumes of a plurality of speaker apparatuses, and thus user convenience may be further enhanced. In addition, since a region for integrated sound volume adjustment is not disposed, and thus it is advantageous to display information of more speaker apparatuses on a user interface window.

Although FIGS. 5 to 10 illustrates the case in which sound volume information is displayed in the form of a scroll bar and sound volume adjusting manipulation is received through a scroll gesture of the scroll bar, sound volume information may be displayed as a text (i.e., a number) and received through a '+' button or '−' button UI displayable next to sound volume information or a number may be directly input, in some exemplary embodiments.

In the above exemplary embodiments, the volume adjustment performed by the volume adjusting manipulation may be an absolute volume adjustment that adjusts the volume of the plurality of connectable speaker apparatuses to an absolute volume level set by the user and/or may be an offset volume adjustment that adjusts the volume of each of the connectable speaker apparatuses by a value that offsets their current volume setting. For example, if a current volume setting of a connectable speaker apparatus is 5 and the volume adjustment is to increase the volume by 10, the new setting of the connectable speaker apparatus in an offset volume setting mode would be 15.

Figure 11:
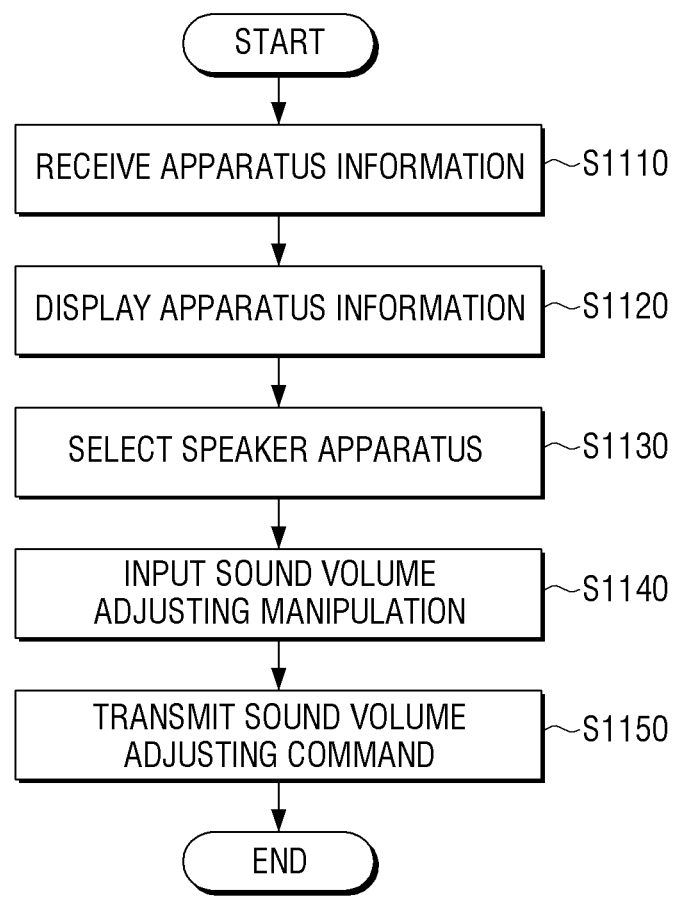
FIG. 11 is a flowchart for explanation of a method for controlling a sound volume of an external speaker apparatus in a user terminal apparatus according to an exemplary embodiment.

FIG. 11 is a flowchart for explanation of a method for controlling a sound volume of an external speaker apparatus in a user terminal apparatus 100 according to an exemplary embodiment.

Referring to FIG. 11, the user terminal apparatus 100 may receive apparatus information from a plurality of connectable speaker apparatuses (operation S1110). In detail, speaker apparatuses positioned in the same network may be searched for and apparatus information may be received from each of the retrieved speaker apparatuses. Here, the apparatus information may include a name of a speaker apparatus, current sound volume information, currently reproduced content information, IP address information, and so on.

In addition, the received apparatus information of plurality of speaker apparatuses may be displayed (operation S1120). In detail, a user interface window for receiving sound volume adjusting manipulation of a plurality of speaker apparatuses may be displayed using apparatus information received in the previous process. The user interface window may display a plurality of first UI elements for adjusting respective sound volumes of a plurality of speaker apparatuses and a plurality of second UI elements for receiving selection of a speaker apparatus.

In addition, a plurality of speaker apparatuses with a sound volume to be adjusted may be selected among a plurality of speaker apparatuses (operation S1130). In addition, second elements of speaker apparatuses grouped among a plurality of second UI elements may be selected.

In addition, one sound volume adjusting manipulation operation of any one of the plurality of selected speaker apparatuses may be received (operation S1140). In detail, the sound volume adjusting manipulation may be received through a first UI of any one of the plurality of selected (or grouped) speaker apparatuses. The sound volume adjusting manipulation may be a scroll gesture on a touchscreen and may be number key manipulation, a touch gesture of a '+' or '−' icon, or the like.

In addition, a sound volume adjusting command corresponding to the input sound volume adjusting manipulation may be transmitted to the plurality of selected speaker apparatuses (operation S1150). In detail, when sound volume adjusting manipulation is received through a user interface window, a sound volume adjusting command corresponding to the sound volume adjusting manipulation may be transmitted a plurality of speaker apparatuses selected by the user. In this case, the sound volume adjusting command may be a 'value of sound volume to be output' or a 'value indicating adjustment degree'. For example, when a sound volume of a speaker may be displayed as a value of 1 to 100, a current sound volume of a specific speaker is 90, and a sound volume value adjusted by the user is 50, the sound volume adjusting command may be a command indicating that 'change the sound volume to 50' or 'apply −40 to the current sound volume'.

Accordingly, the sound volume controlling method according to the exemplary embodiment may easily adjust sound volumes of a plurality of speaker apparatuses to be adjusted, thereby enhancing user convenience. The volume controlling method illustrated in FIG. 11 may also be performed by a user terminal apparatus including components of FIG. 2 or 3 or may also be performed by a user terminal apparatus including other components.

In addition, at least one execution program (or application) for execution of the aforementioned sound volume controlling method may be embodied, and the execution program may be stored in a non-transitory computer readable medium, and be provided.

The non-transitory computer readable medium is a medium which does not store data temporarily such as a register, cash, and memory but stores data semi-permanently and is readable by devices. More specifically, the aforementioned applications or programs may be stored in the non-transitory computer readable media such as compact disks (CDs), digital video disks (DVDs), hard disks, Blu-ray disks, universal serial buses (USBs), memory cards, and read-only memory (ROM).

The foregoing exemplary embodiments and advantages are merely exemplary and are not to be construed as limiting. The present teaching can be readily applied to other types of apparatuses. Moreover, the description of the exemplary embodiments is intended to be illustrative, and not to limit the scope of the claims, and many alternatives, modifications, and variations will be apparent to those skilled in the art.

What is claimed is:

1. A sound volume outputting system comprising:
   a plurality of speaker apparatuses; and
   a user terminal apparatus having a screen and configured to:
   display information of a first speaker apparatus and information of a second speaker apparatus,
   display a first selection user interface (UI) element for receiving a selection of the first speaker apparatus, and a second selection UI element for receiving a selection of the second speaker apparatus,
   display a first volume adjusting UI element for adjusting sound volume of the first speaker apparatus and a second volume adjusting UI element for adjusting sound volume of the second speaker apparatus, in response to a volume adjusting input being received through the first volume adjusting UI element while the first selection UI element is not selected, transmit a sound volume adjusting command to the first speaker to adjust the sound volume of only the first speaker apparatus, and in response to a volume adjusting input being received through the first volume adjusting UI element while the first selection UI element and the second selection UI element are selected, transmit a sound volume adjusting command to the first speaker apparatus and the second speaker apparatus to simultaneously adjust the sound volume of the first speaker apparatus and the sound volume of the second speaker apparatus.

2. The sound volume outputting system as claimed in claim 1, wherein each of the plurality of speaker apparatuses separately receives and outputs sound source content from an external server.

3. The sound volume outputting system as claimed in claim 1, wherein:

the sound volume adjusting input is a mute input; and in response to the mute input being received through the first volume adjusting UI element while the first selection UI element and the second selection UI element are selected, the user terminal apparatus transmits a mute command to the first speaker and the second speaker.

4. The sound volume outputting system as claimed in claim 1, wherein:

the first selection UI element and the second selection UI element are for adjusting sound volume of the first speaker and the second speaker by grouping.

5. A method for controlling a sound volume of an external speaker apparatus in a user terminal apparatus having a screen, the method comprising:

displaying information of a first speaker and information of a second speaker;

displaying a first selection user interface (UI) element for receiving a selection of the first speaker, and a second selection UI element for receiving a selection of the second speaker;

displaying a first volume adjusting UI element for adjusting sound volume of the first speaker and a second volume adjusting UI element for adjusting sound volume of the second speaker;

in response to a volume adjusting input being received through the first volume adjusting UI element while the first selection UI element is not selected, transmitting a sound volume adjusting command to the first speaker to adjust the sound volume of only the first speaker; and in response to a volume adjusting input being received through the first volume adjusting UI element while the first selection UI element and the second selection UI element are selected, transmitting a sound volume adjusting command to the first speaker and the second speaker to simultaneously adjust the sound volume of the first speaker and the sound volume of the second speaker.

6. The method as claimed in claim 5, further comprising changing the first volume adjusting UI element and the second volume adjusting UI element based on the sound volume adjusting input while the first selection UI element and the second selection UI element are selected.

7. The method as claimed in claim 6, wherein:

the sound volume adjusting input is a mute input; and the transmitting the sound volume adjusting command to the first speaker and the second speaker comprises transmitting a mute command to the first speaker and the second speaker while the first selection UI element and the second selection UI element are selected.

8. The method as claimed in claim 5, further comprising:

receiving a manipulation of a sound volume adjusting button disposed on a lateral surface of the user terminal apparatus: and changing the first volume adjusting UI element and the second volume adjusting UI element based on the manipulation of the sound volume adjusting button while the first selection UI element and the second selection UI element are selected.

9. The method as claimed in claim 5, wherein:

each of the first volume adjusting UI element and the first volume adjusting UI element comprise a bar and a pointer moveable on the bar; and each of the first selection UI element and the second selection UI element comprises a check box.

10. The method as claimed in claim 5, further comprising displaying a first mute UI element for receiving a mute command of the first speaker, a second mute UI element for receiving a mute command of the second speaker, and information of content that is currently being reproduced by the first speaker and the second speaker.

11. The method as claimed in claim 5, wherein: the user terminal apparatus is wirelessly connected to an access point; and wherein the method further comprises receiving apparatus information from a plurality of external speaker apparatuses connected to the access point.

12. The method as claimed in claim 11, wherein:

the receiving of the apparatus information comprises receiving reproduced content information from the plurality of external speaker apparatuses connected to the access point; and wherein the method further comprises displaying only a selection UI element and a volume adjusting UI element of speaker apparatuses, which are outputting the same content, based on the received reproduced content information.

13. A non-transitory computer-readable recording medium storing instructions that, when executed, cause at least one processor to perform a method for controlling a sound volume of an external speaker in a user terminal apparatus having a screen, the method comprising:

displaying information of a first speaker and information of a second speaker;

displaying a first selection user interface (UI) element for receiving a selection of the first speaker, and a second selection UI element for receiving a selection of the second speaker;

displaying a first volume adjusting UI element for adjusting sound volume of the first speaker and a second volume adjusting UI element for adjusting sound volume of the second speaker;

in response to a volume adjusting input being received through the first volume adjusting UI element while the first selection UI element is not selected, transmitting a sound volume adjusting command to the first speaker to adjust the sound volume of only the first speaker; and in response to a volume adjusting input being received through the first volume adjusting UI element while the first selection UI element and the second selection UI element are selected, transmitting a sound volume adjusting command to the first speaker and the second speaker to simultaneously adjust the sound volume of the first speaker and the sound volume of the second speaker.

14. The non-transitory computer-readable recording medium as claimed in claim 13, further comprising changing the first volume adjusting UI element and the second volume adjusting UI element based on the sound volume adjusting input while the first selection UI element and the second selection UI element are selected.

15. The non-transitory computer-readable recording medium as claimed in claim 14, wherein:
the sound volume adjusting input is a mute input; and
the transmitting the sound volume adjusting command to the first speaker and the second speaker comprises transmitting a mute command to the first speaker and the second speaker while the first selection UI element and the second selection UI element are selected.

16. The non-transitory computer-readable recording medium as claimed in claim 13, further comprising:
receiving a manipulation of a sound volume adjusting button disposed on a lateral surface of the user terminal apparatus; and
changing the first volume adjusting UI element and the second volume adjusting UI element based on the manipulation of the sound volume adjusting button while the first selection UI element and the second selection UI element are selected.

17. The non-transitory computer-readable recording medium as claimed in claim 13, wherein:
each of the first volume adjusting UI element and the first volume adjusting UI element comprise a bar and a pointer moveable on the bar; and
each of the first selection UI element and the second selection UI element comprises a check box.

18. The non-transitory computer-readable recording medium as claimed in claim 13, wherein the method further comprises displaying a first mute UI element for receiving a mute command of the first speaker, a second mute UI element for receiving a mute command of the second speaker, and information of content that is currently being reproduced by the first speaker and the second speaker.

19. The non-transitory computer-readable recording medium as claimed in claim 13, wherein: the user terminal apparatus is wirelessly connected to an access point; and
wherein the method further comprises receiving apparatus information from a plurality of external speaker apparatuses connected to the access point.

20. The non-transitory computer-readable recording medium as claimed in claim 19, wherein:
the receiving of the apparatus information comprises receiving reproduced content information from the plurality of external speaker apparatuses connected to the access point; and
wherein the method further comprises displaying only a selection UI element and a volume adjusting UI element of speaker apparatuses, which are outputting the same content, based on the received reproduced content information.

* * * * *